(12) United States Patent
Lee et al.

(10) Patent No.: US 10,903,241 B2
(45) Date of Patent: Jan. 26, 2021

(54) SYSTEM OF FORMING DEBONDING LAYER, METHOD OF FORMING DEBONDING LAYER, SYSTEM OF MANUFACTURING DISPLAY DEVICE USING DEBONDING LAYER AND METHOD OF MANUFACTURING DISPLAY DEVICE DEBONDING LAYER

(71) Applicant: SAMSUNG DISPLAY CO., LTD., Yongin-si (KR)

(72) Inventors: Minwoo Lee, Seoul (KR); Byunghoon Kang, Hwaseong-si (KR); Heekyun Shin, Incheon (KR); Seungjun Moon, Cheonan-si (KR); Woojin Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 133 days.

(21) Appl. No.: 16/031,543

(22) Filed: Jul. 10, 2018

(65) Prior Publication Data

US 2019/0123068 A1 Apr. 25, 2019

(30) Foreign Application Priority Data

Oct. 24, 2017 (KR) .......................... 10-2017-0138293

(51) Int. Cl.
*H01L 27/12* (2006.01)
*H01L 27/32* (2006.01)
(Continued)

(52) U.S. Cl.
CPC ...... *H01L 27/1218* (2013.01); *H01L 27/1262* (2013.01); *H01L 27/1266* (2013.01);
(Continued)

(58) Field of Classification Search
CPC ................. H01L 51/0097; H01L 51/56; H01L 2251/5338; H01L 51/003; H01L 51/442;
(Continued)

(56) References Cited

U.S. PATENT DOCUMENTS 5,517,312 A * 5/1996 Finarov ................ G01B 11/065
356/630
2002/0142493 A1* 10/2002 Halliyal ............. G01B 11/0683
438/14
(Continued)

FOREIGN PATENT DOCUMENTS

KR 1020150034829 4/2015
KR 101580015 12/2015
KR 1020170092748 8/2017

*Primary Examiner* — Michael P Stafira
(74) *Attorney, Agent, or Firm* — F. Chau & Associates, LLC

(57) ABSTRACT

A system of forming a debonding layer includes a debonding layer forming device configured to form a coating layer by coating a graphene oxide layer on a support substrate. The debonding layer forming device is configured to form a debonding layer by heat-treating the coating layer. An optical measuring device is configured to classify the support substrate into a plurality of cell areas. The optical measuring device is configured to measure a thickness of at least one of the coating layer in at least one cell area of the plurality of cell areas.

20 Claims, 9 Drawing Sheets

(51) Int. Cl.
*H01L 51/52* (2006.01)
*H01L 51/00* (2006.01)

(52) U.S. Cl.
CPC ...... *H01L 27/3225* (2013.01); *H01L 27/3262* (2013.01); *H01L 51/5253* (2013.01); *H01L 51/0097* (2013.01); *H01L 2227/326* (2013.01)

(58) Field of Classification Search
CPC .......... H01L 51/5253; H01L 2227/326; H01L 27/32; H01L 27/3244; H01L 31/022475; H01L 31/022483; H01L 51/5215; H01L 21/76843; H01L 2251/303; H01L 2251/308; H01L 2251/5369; H01L 2251/558; H01L 27/1218; H01L 27/124; H01L 27/1255; H01L 27/1262; H01L 27/1266; H01L 27/323; H01L 27/3262; H01L 29/401; H01L 29/786; H01L 31/022425; H01L 51/0021; H01L 51/105; H01L 51/50; H01L 51/5056; H01L 21/02381; H01L 21/0242; H01L 21/02444; H01L 21/02513; H01L 21/0254; H01L 21/0262; H01L 21/02658; H01L 21/288; H01L 21/4846; H01L 21/76804; H01L 21/76816; H01L 21/76823; H01L 21/76834; H01L 21/76844; H01L 21/76847; H01L 21/76849; H01L 21/76867; H01L 21/76873; H01L 21/76874; H01L 21/76877; H01L 21/76883; H01L 21/76885; H01L 21/823475; H01L 2251/301; H01L 2251/305; H01L 2251/5323; H01L 2251/552; H01L 23/28; H01L 23/291; H01L 23/49866; H01L 23/5226; H01L 23/5283; H01L 23/53209; H01L 23/53223; H01L 23/53228; H01L 23/53238; H01L 23/53242; H01L 23/53252; H01L 23/53266; H01L 23/5329; H01L 23/53295; H01L 27/1225; H01L 27/1248; H01L 27/1288; H01L 27/156; H01L 27/3225; H01L 27/3258; H01L 2933/0016; H01L 2933/0025; H01L 29/0673; H01L 29/1029; H01L 29/1606; H01L 29/41; H01L 29/4908; H01L 29/66037; H01L 29/78684; H01L 29/7869; H01L 31/02164; H01L 31/022466; H01L 31/022491; H01L 31/0481; H01L 31/1884; H01L 33/0041; H01L 33/0054; H01L 33/007; H01L 33/06; H01L 33/12; H01L 33/32; H01L 33/34; H01L 33/405; H01L 33/44; H01L 51/00; H01L 51/0023; H01L 51/0045; H01L 51/0048; H01L 51/055; H01L 51/4253; H01L 51/441; H01L 51/502; H01L 51/5076; H01L 51/508; H01L 51/5084; H01L 51/5096; H01L 51/52; H01L 51/5203; H01L 51/5206; H01L 51/5212; H01L 51/5234; H01L 51/5237; G01J 1/429; G01J 5/046; G01J 5/10; G01J 5/20; G01J 5/22; G01N 1/286; G01N 1/4044; G01N 1/4077; G01N 2001/2866; G01N 2001/4088; G01N 2021/6439; G01N 21/6452; G01N 2291/0231; G01N 2291/0258; G01N 2291/0289; G01N 2291/0421; G01N 2291/101; G01N 2291/2638; G01N 2291/2694; G01N 2333/415; G01N 27/04; G01N 27/041; G01N 27/045; G01N 27/121; G01N 27/128; G01N 27/226; G01N 27/304; G01N 27/308; G01N 27/3275; G01N 27/416; G01N 27/48; G01N 2800/122; G01N 2800/2821; G01N 29/043; G01N 29/07; G01N 29/2431; G01N 29/2475; G01N 33/00; G01N 33/02; G01N 33/025; G01N 33/48735; G01N 33/497; G01N 33/5302; G01N 33/5308; G01N 33/54326; G01N 33/54353; G01N 33/54366; G01N 33/5438; G01N 33/54393; G01N 33/544; G01N 33/551; G01N 33/552; G01N 33/68; G01N 33/6872

See application file for complete search history.

(56) References Cited

U.S. PATENT DOCUMENTS

| | | | | |
|---|---|---|---|---|
| 2003/0001120 | A1* | 1/2003 | Nishiyama | G01N 21/274 250/559.45 |
| 2005/0227385 | A1* | 10/2005 | Tan | H01L 27/3293 438/15 |
| 2012/0320380 | A1* | 12/2012 | Schonleber | G01B 11/2441 356/479 |
| 2014/0114597 | A1* | 4/2014 | Chen | G01B 11/24 702/84 |
| 2014/0272199 | A1* | 9/2014 | Lin | H01L 51/444 427/600 |
| 2015/0060869 | A1 | 3/2015 | Ro et al. | |
| 2015/0060870 | A1* | 3/2015 | Ro | H01L 27/1218 257/72 |
| 2015/0219565 | A1* | 8/2015 | Iliopoulos | G01B 11/0625 427/10 |
| 2016/0033259 | A1* | 2/2016 | Komaragiri | G01B 11/0641 356/364 |
| 2017/0088944 | A1* | 3/2017 | Sultana | G02B 6/3624 |
| 2017/0221970 | A1 | 8/2017 | Lee et al. | |
| 2018/0347965 | A1* | 12/2018 | Inoue | G01B 11/0625 |

* cited by examiner (a)

(b)

(c)

(d)

(e)

(f)

SYSTEM OF FORMING DEBONDING LAYER, METHOD OF FORMING DEBONDING LAYER, SYSTEM OF MANUFACTURING DISPLAY DEVICE USING DEBONDING LAYER AND METHOD OF MANUFACTURING DISPLAY DEVICE DEBONDING LAYER

CROSS-REFERENCE TO RELATED APPLICATION

This application claims priority under 35 U.S.C, § 119 to Korean Patent Application No. 10-2017-0138293, filed on Oct. 24, 2017, in the Korean Intellectual Property Office (KIPO), the disclosure of which is incorporated by reference herein in its entirety.

TECHNICAL FIELD

Exemplary embodiments of the present invention relate to a system of forming a debonding layer, and more particularly to a method of forming the debonding layer, a system of manufacturing a display device using the debonding layer, and a method of manufacturing a display device using the debonding layer.

DISCUSSION OF RELATED ART

Display devices include flexible display devices that are bendable. Such flexible display devices may be used in various fields, for example, in a folded or curved form. The flexible display devices may have a structure in which a display element is disposed on a flexible substrate. Examples of the display elements that may be applicable to the flexible display devices may include organic light emitting diodes ("OLED"), liquid crystal display ("LCD") elements, or electrophoretic display (EPD) elements. OLEDs may be manufactured into a stack structure of a thin film shape and to be relatively flexible.

Substrates of flexible display devices may be curved or folded in various manufacturing processes involved in manufacturing flat panel information display devices, such as cleaning processes, thin film deposition processes, and patterning processes. Thus, alignment between masks used in the manufacturing processes may result in thickness non-uniformity in the thin film deposition.

SUMMARY

An exemplary embodiment of the present invention is directed to a system of forming a debonding layer having a substantially uniform thickness. An exemplary embodiment of the present invention is directed to a method of forming a debonding layer and reducing or preventing damage to a flexible substrate. An exemplary embodiment of the present invention is directed to separating a support substrate and the flexible substrate without causing damage to the flexible substrate.

According to an exemplary embodiment of the present invention, a system of forming a debonding layer includes a debonding layer forming device configured to form a coating layer by coating a graphene oxide layer on a support substrate. The debonding layer forming device is configured to form a debonding layer by heat-treating the coating layer. An optical measuring device is configured to classify the support substrate into a plurality of cell areas. The optical measuring device is configured to measure a thickness of at least one of the coating layer in at least one cell area of the plurality of cell areas.

The optical measuring device may output coordinate information of a defective cell of the plurality of cell areas. The defective cell is determined based on a value measured by the optical measuring device that is out of a predetermined reference range.

The debonding layer forming device may re-coat a re-coated graphene oxide layer on the support substrate of the defective cell area based on the coordinate information.

The optical measuring device may include an ellipsometer for measuring a reflectance of the coating layer.

The optical measuring device may include a spectrometer for measuring a transmittance of the debonding layer.

The optical measuring device may irradiate a light having a wavelength in a range from about 400 nm to about 800 nm to the support substrate to measure the thickness of the at least one of the coating layer or the debonding layer.

The debonding layer forming device may electrolytically treat a surface of the support substrate so that the surface of the support substrate is negatively charged. The debonding layer forming device may form a first coating layer on the surface of the support substrate by using an electrostatic attraction force of a positively charged polymer electrolyte. The debonding layer forming device may form a second coating layer on the first coating layer by coating a negatively charged graphene oxide on the first coating layer.

The debonding layer forming device may repeat formation of the first coating layer or formation of the second coating layer one or more times.

According to an exemplary embodiment of the present invention, a method of forming a debonding layer includes forming a coating layer by coating a graphene oxide layer on a support substrate. The method includes forming a debonding layer by heat-treating the coating layer. The method includes classifying the support substrate into a plurality of cell areas and measuring a thickness of at least one of the coating layer or the debonding layer in at least one cell area of the plurality of cell areas.

Measuring of a thickness of at least one of the coating layer and the debonding layer may include measuring a reflectance or a transmittance of each of the cell areas of the plurality of cell areas. Measuring of a thickness of at least one of the coating layer and the debonding layer may include calculating a thickness of each of the cell areas of the plurality of cell areas based on the reflectance or transmittance. Measuring of a thickness of at least one of the coating layer and the debonding layer may include comparing the thickness of each of the cell areas of the plurality of cell areas with a predetermined reference range. When there is a defective cell area in which the thickness is out of the predetermined reference range, coordinate information of the defective cell area may be determined.

The method may include re-coating a second graphene oxide layer on the support substrate of the defective cell area based on the coordinate information of the defective cell area.

A reflectance of the coating layer may be measured by an ellipsometer.

A transmittance of the debonding layer may be measured by a spectrometer.

Light having a wavelength in a range from about 400 nm to about 800 nm may be transmitted to the support substrate to measure a thickness of the support substrate.

Forming the coating layer may include electrolytically treating a surface of the support substrate so that the surface of the support substrate is negatively charged. Forming the coating layer may include forming a first coating layer on the surface of the support substrate by using an electrostatic attraction force of a positively charged polymer electrolyte. Forming the coating layer may include forming a second coating layer on the first coating layer by coating a negatively charged graphene oxide on the first coating layer.

Forming of the first coating layer or forming of the second coating layer may be repeated one or more times.

According to an exemplary embodiment of the present invention, a method of manufacturing a display device includes forming a coating layer by coating a graphene oxide layer on a support substrate. The method includes forming a debonding layer by heat-treating the coating layer. The method includes classifying the support substrate into a plurality of cell areas. The method includes measuring a thickness of at least one of the coating layer or the debonding layer in at least one cell area of the plurality of cell areas. The method includes forming a substrate on the debonding layer. The method includes performing a TFT process on the substrate. The method includes separating the substrate and the support substrate by using the debonding layer.

Coordinate information of a defective cell having a thickness that is out of a predetermined reference range may be determined.

According to an exemplary embodiment of the present invention, a method of manufacturing a display device includes forming a coating layer by coating a graphene oxide layer on a support substrate. The coating layer is formed by electrolytically treating a surface of the support substrate so that the surface of the support substrate is negatively charged. The coating layer is formed by forming a first coating layer on the surface of the support substrate by using an electrostatic attraction force of a positively charged polymer electrolyte, and forming a second coating layer on the first coating layer by coating a negatively charged graphene oxide on the first coating layer. The method includes forming a debonding layer by heat-treating the coating layer. The method includes disposing a substrate on the debonding layer. The method includes performing a TFT process on the substrate. The method includes separating the support substrate and the debonding layer. The method includes classifying the support substrate into a plurality of cell areas and measuring a thickness of one or more of the coating layer or the debonding layer for each cell area of the plurality of cell areas.

Measuring of a thickness of one or more of the coating layer or the debonding layer may include measuring a reflectance or a transmittance of each of the cell areas of the plurality of cell areas of the support substrate. Measuring of a thickness of one or more of the coating layer or the debonding layer may include calculating a thickness of each of the cell areas of the plurality of cell areas based on the reflectance or transmittance. Measuring of a thickness of one or more of the coating layer or the debonding layer may include comparing the thickness of each of the cell areas of the plurality of cell areas with a predetermined reference range. When there is a defective cell area in which the thickness is out of the predetermined reference range, coordinate information of the defective cell area may be determined.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
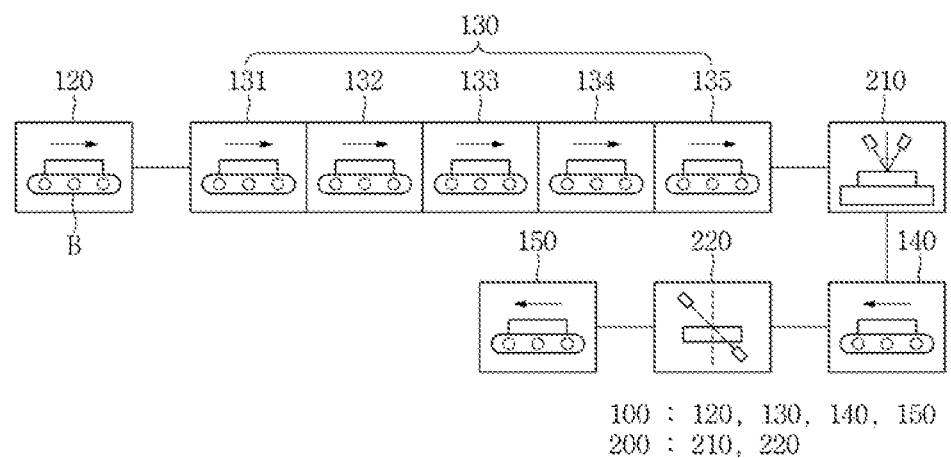
FIG. 1 is a conceptual view illustrating a debonding layer forming device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

In the drawings, thicknesses of layers or a plurality of layers and areas may be exaggerated for clarity of description. It will be understood that when a component, such as a layer, a film, a region, or a plate, is referred to as being "on" another component, the component may be directly on the other component or intervening components may be present.

When an element is referred to as being "connected" to another element, the element may be "directly connected" to the other element, or "electrically connected" to the other element with one or more intervening elements disposed therebetween.

It will be understood that although the terms "first" and "second" may be used herein to describe various components, these components should not be limited by these terms.

"About" or "approximately" as used herein may be inclusive of the stated value and means within an acceptable range of variation for the particular value as determined by one of ordinary skill in the art, considering the measurement in question and the error associated with measurement of the particular quantity e.g., the limitations of the measurement system). For example, "about" may mean within one or more standard variations, or within ±30% 20%, 10%, 5% of the stated value.

Like reference numerals may refer to like elements throughout the specification and drawings.

A system of forming a debonding layer will be described in more detail below with reference to FIGS. 1 to 7.

Figure 2:
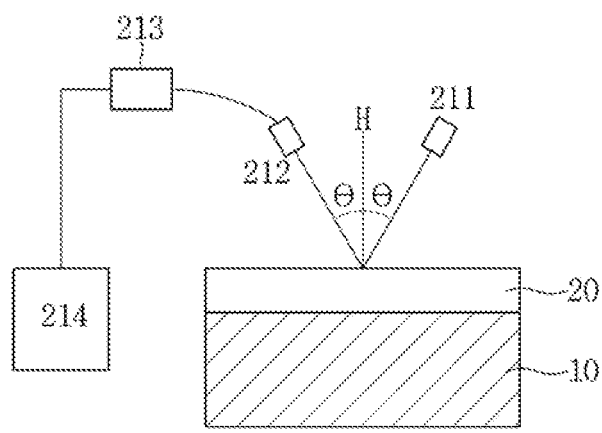
FIG. 2 is a schematic view illustrating a first optical measuring portion according to an exemplary embodiment of the present invention.
Figure 3:
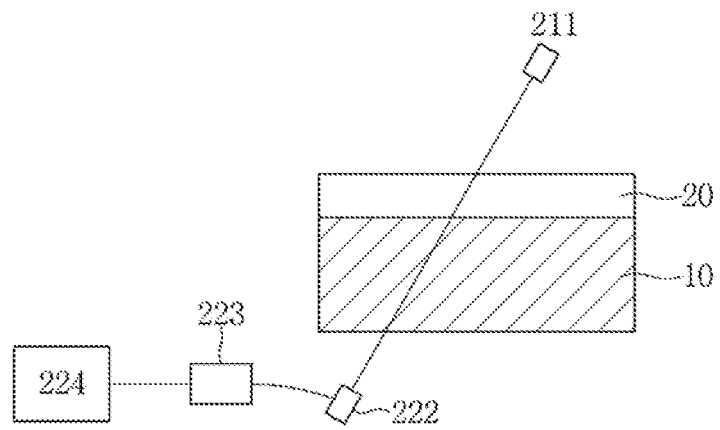
FIG. 3 is a schematic view illustrating a second optical measuring portion according to an exemplary embodiment of the present invention.

FIG. 1 is a conceptual view illustrating a debonding layer forming device according to an exemplary embodiment of the present invention. FIG. 2 is a schematic view illustrating a first optical measuring portion according to an exemplary embodiment of the present invention. FIG. 3 is a schematic view illustrating a second optical measuring portion according to an exemplary embodiment of the present invention.

Figure 4:
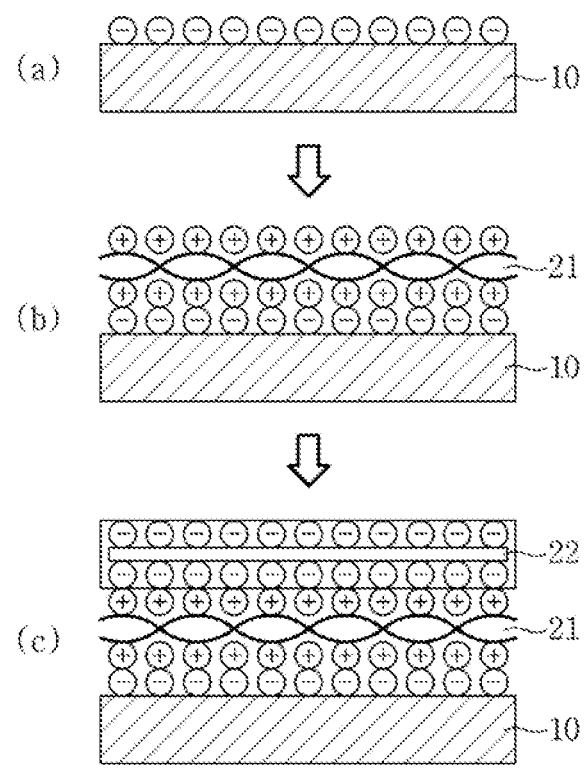
FIG. 4 is a cross-sectional view illustrating a process of forming a debonding layer according to an exemplary embodiment of the present invention.
Figure 5:
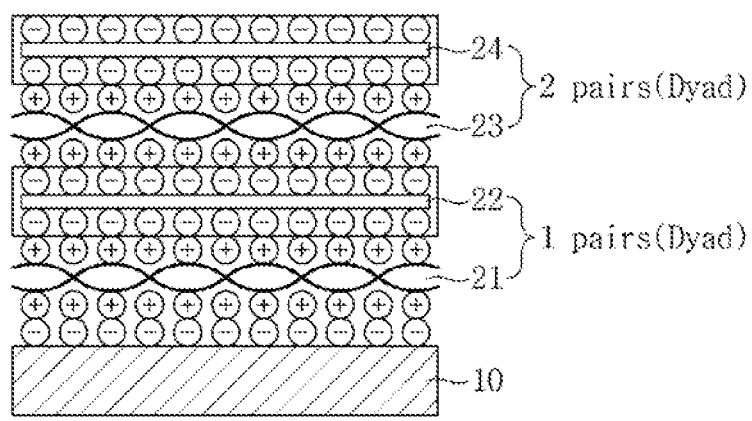
FIG. 5 is a cross-sectional view illustrating a dyad debonding layer according to an exemplary embodiment of the present invention.

FIG. 4 is a cross-sectional view illustrating a process of forming a debonding layer according to an exemplary embodiment of the present invention. FIG. 4 includes portions (a), (b) and (c). FIG. 5 is a cross-sectional view illustrating a dyad debonding layer according to an exemplary embodiment of the present invention.

Referring to FIG. 1, a system of forming a debonding layer may include a debonding layer forming device 100 and an optical measuring device 200.

The debonding layer forming device 100 may include a loading portion 120, a coating portion 130, a heat treatment portion 140 and an unloading portion 150. The optical measuring device 200 may include a first optical measuring portion 210 and a second optical measuring portion 220. In an exemplary embodiment of the present invention, a separate transfer chamber, and/or a connection chamber may be connected between each device and each unit. Thus, each chamber (e.g., 131, 132, 133, 134 and 135 described in more detail below) of the coating portion 130 may include a transfer chamber and at least one connection chamber connecting the transfers chambers to each other. As an example, a connection chamber may connect a transfer chamber of the coating portion 130 with a loading chamber (e.g., loading portion 120, which is described below in more detail), a heat treatment chamber (e.g., heat treatment portion 140, which is described below in more detail) or an unloading chamber (e.g., unloading portion 150, which is described below in more detail). Each chamber (e.g., 131, 132, 133, 134 and 135 described in more detail below) of the coating portion 130 may be a process chamber for performing a coating process, such as electrolytic treatment, coating, rinsing or drying, as discussed below in more detail. Each chamber may be a sealed chamber isolated from outside the coating portion 130 each chamber may be in an airtight chamber).

As an example, the debonding layer forming device 100 and the optical measuring device 200 may include the loading portion 120, the coating portion 130, the heat treatment portion 140, the unloading portion 150, the first optical measuring portion 210 and the second optical measuring portion 220 formed in an in-line manner, but exemplary embodiments of the present invention are not limited thereto. In an exemplary embodiment of the present invention, the loading portion 120, the coating portion 130, the heat treatment portion 140, the unloading portion 150, the first optical measuring portion 210 and the second optical measuring portion 220 may be individually positioned as desired, and each output of a preceding process is supplied to a succeeding process (e.g., by being passed from a first chamber to a second chamber by a connection chamber connecting adjacent chambers, such as adjacent process chambers).

The loading portion 120 may receive a support substrate 10 from outside the loading portion 120 and provides the support substrate 10 to the coating portion 130 (e.g., through a connection chamber). In an exemplary embodiment of the present invention, a conveyor B, or a robot arm may be positioned at the loading portion 120 to transfer the support substrate 10. Thus, the support substrate 10 may be positioned on the conveyor B and the conveyor B may convey the support substrate 10 through the loading portion 120, through a connection chamber, and into a chamber of the coating portion 130. As an example, a case in which the support substrate 10 is transferred through the conveyor B will be described in more detail below.

The support substrate 10 is configured to support a thin film substrate and substantially prevent it from warping in a thin film transistor (TFT) process. As an example, the support substrate may warp as a result of having a relatively small thickness. The support substrate 10 may include glass, or quartz, but may include any suitable rigid material that may support a flexible substrate in the subsequent TFT process.

The support substrate 10 may be transferred to the coating portion 130 from the loading portion 120. In an exemplary embodiment of the present invention, the coating portion 130 coats a graphene oxide layer on the support substrate 10. Thus, the coating portion 130 may be a process chamber configured to coat the graphene oxide layer on the support substrate 10.

The coating portion 130 may include an electrolytic treatment portion 131, a first coating portion 132, a second coating portion 133, a rinsing portion 134 and a drying portion 135. Thus, the electrolytic treatment portion 131 may be a process chamber configured to perform electrolytic treatment on the support substrate 10. The first coating portion 132 may be a process chamber configured to form a first coat on the support substrate 10. The second coating portion 133 may be a process chamber configured to form a second coat on the support substrate 10. The rinsing portion 134 may be a process chamber configured to rinse the support substrate 10. The drying portion 135 may be a process chamber configured to dry the support substrate 10.

In the coating portion 130, the conveyor B may pass through the electrolytic treatment portion 131, the first coating portion 132, the second coating portion 133, the rinsing portion 134 and the drying portion 135, such that the support substrate 10 may be transferred sequentially to the electrolytic treatment portion 131, the first coating portion 132, the second coating portion 133, the rinsing portion 134, and the drying portion 135 to be coated. In an exemplary embodiment of the present invention, the electrolytic treatment portion 131, the first coating portion 132, the second coating portion 133, the rinsing portion 134, and the drying portion 135 may be connected to each other in an in-line manner (e.g., by connection chambers connected therebetween), but exemplary embodiments of the present invention are not limited thereto. In an exemplary embodiment of the present invention, the processes in the coating portion 130 may be performed in a single chamber. For example, electrolytic treatment, coating formation, rinsing and drying of the support substrate 10 may be formed in a single process chamber configured to perform each of these processes.

The electrolytic treatment portion 131 may treat a surface (e.g., an upper surface) of the support substrate 10 so as to be negatively charged (see, e.g., FIG. 4).

The electrolytic treatment portion 131 may perform a piranha solution treatment or a plasma treatment on the surface of the support substrate 10 to charge the surface of the support substrate 10.

For example, the piranha solution may be a relatively strong oxidizer solution in which a concentrated sulfuric acid and a 30% hydrogen peroxide solution are mixed at a ratio in a range of from about 3:1 to about 7:1, which serves to form a hydroxyl group (OH group) on the surface of the support substrate 10 to impart negative charge.

Similarly, when the $O_2$ plasma treatment is performed on the surface of the support substrate 10, a number of hydroxyl groups may be formed on the surface of the support substrate 10, such that the surface of the support substrate 10 is negatively charged (see, e.g., FIG. 4, portion (a)).

The first coating portion 132 may form a first coating layer 21 on the surface (e.g., the upper surface) of the support substrate 10 which is charged (see, e.g., FIG. 4, portion (b)) by using an electrostatic attraction force of a positively charged polymer electrolyte.

For example, the support substrate 10 may be coated by immersing the support substrate 10 in a water tank including a positively charged polymer electrolyte or by spraying a positively charged polymer electrolyte onto the support substrate 10. In an exemplary embodiment of the present invention, positively charged particles are attracted by an electrostatic attraction force to the surface of the support substrate 10 which is negatively charged and thus the surface of the support substrate 10 (e.g., the upper surface) may be coated. As the coating progresses, the negative charge on the surface of the support substrate 10 may be shielded, and finally the surface of the support substrate 10 may become positively charged. In this step, an electrostatic repulsion force between positive charges coated on the surface of the support substrate 10 and the polymer electrolyte may substantially prevent the coating process from proceeding past a desired point.

A material for the polymer electrolyte is not limited to a particular material. According to an exemplary embodiment of the present invention, the polymer electrolyte is ionized in an aqueous solution to be positively charged. Examples of polymer electrolyte may include any one or a mixture of two or more selected from polystyrene sulfonate) (PSS), polyethylene imine) (PEI), poly(allyl amine) (PAA), poly(diallyldimethylammonium chloride) (PDDA), poly(N-isopropyl acrylamide) (PNIPAM), chitosan (CS), poly(methacrylic acid) (PMA), polyvinyl sulfate (PVS), poly(amic acid) (PAA), or poly (allylamine) (PAH).

The second coating portion 133 may form a second coating layer 22 by immersing the support substrate, on which the first coating layer of positive charge is formed, in a solution in which a graphene oxide of negative charge is dispersed or spraying a solution in which the graphene oxide is dispersed (see, e.g., FIG. 4, portion (c)).

An electrostatic attraction force may act between the support substrate on which the first coating layer 21 of positive charge is formed and the graphene oxide of negative charge, as in the case of the first coating portion 132, such that the graphene oxide is attracted to the surface of the first coating layer 21. Then, an electrostatic repulsion force may act between a coated graphene oxide layer (e.g., a second coating layer) and the graphene oxide in the solution, such that coating process need not further proceed beyond a desired point.

The rinsing portion 134 may spray a non-polar water onto the support substrate 10 on which the second coating layer 21 is formed. In an exemplary embodiment of the present invention, the nonpolar water may be formed through electrolysis, and for example, the nonpolar water may be an ultra-pure water.

The drying portion 135 may dry the non-polar water sprayed for rinsing. The drying portion 135 may be, for example, an air knife.

The support substrate 10 on which the coating layer is formed may be transferred to the first optical measuring portion 210.

According to an exemplary embodiment of the present invention, a case in which each of the first coating layer 21 and the second coating layer 22 is formed as a single layer is described as an example. However, each of the first coating layer 21 and the second coating layer 22 may include two layers or three or more layers, as described below in more detail with reference to FIGS. 4 and 5.

Referring to FIGS. 4 and 5, the coating layer 20 may include the first coating layer 21 and the second coating layer 22. The first coating layer 21 and the second coating layer 22 may be referred to as a dyad (e.g., a first dyad). The coating layer may additionally include a third coating layer 23 and a fourth coating layer 24. The third coating layer 23 and the fourth coating layer 24 may be referred to as a dyad (e.g., a second dyad). The first dyad may be disposed on the support substrate 10 and the second dyad may be disposed on the first dyad.

The first optical measuring portion 210 may be an ellipsometer.

An exemplary embodiment of the present invention in which an ellipsometer is used as the first optical measuring portion 210 will be described in more detail below.

The ellipsometer 210 may include a light source 211, a light obtainer 212, a spectroscope 213, and a controller 214.

The ellipsometer 210 transmits light to a coating layer 20 formed on the support substrate 10 through the light source 211, and also receives a light reflected from the coating layer 20 by the light obtainer 212. The coating layer 20 may include first and second coating layers (e.g., first coating layer 21 and second coating layer 22). The light obtainer 212 may be connected to the spectroscope 213. The spectroscope 213 may perform measurement for each wavelength of light and may transmit the measurement result to the controller 214. The controller 214 may perform analysis of the received measurement result. Thus, the ellipsometer 210 may measure an amount of light reflected from the coating layer 20 (e.g., an amount of each detected wavelength of light).

The ellipsometer 210 may transmit light having a wavelength in a range of from about 400 nm to about 800 nm to the coating layer 20 disposed on the support substrate 10.

A position of the light obtainer 212 may be adjusted (e.g., to be at different height heights) in accordance with movement of the light source 211 so that a reflection angle $\theta$ and an incident angle $\theta$ are substantially equal to each other. For example, the angle $\theta$ may be in a range of from about 10° to about 50° with respect to a vertical line H that is orthogonal to an upper surface of the coating layer 20.

The spectroscope 213 may change a wavelength of the light received from the light obtainer 212 using a diffraction grating, and may provide a polarization state value according to the wavelength. The polarization state value may include a reflection coefficient ratio (psi) and a phase difference (delta).

The controller 214 may be electrically connected to an input device, and/or a memory.

The controller 214 may interpret a signal transmitted from the spectroscope 213 based on an information stored in the memory. The controller 214 may be configured to classify (e.g., differentiate into distinct physical areas) a measurement area into a plurality of cell areas based on the information stored in the memory, may interpret the signal transmitted from the spectroscope 213, and may calculate a reflectance and a thickness of each cell area. For example, a greater detected reflectance may indicate a relatively thicker cell area. Thus, the ellipsometer 210 may be classify the support substrate 10 into a plurality of cell areas and to measure a thickness of the coating layer 20 (e.g., the coating layer 20 may be a debonding layer) in at least one cell area of the plurality of cell areas.

Figure 6:
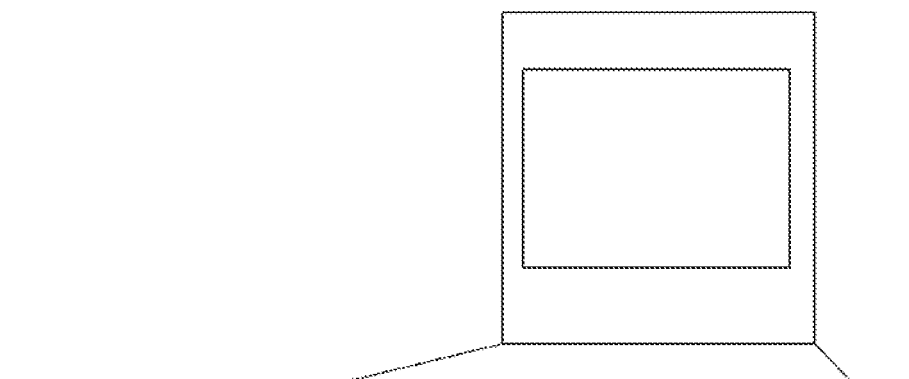
FIG. 6 is a diagram illustrating exemplary thickness and reflectance outputs of a substrate for each of cell areas of a first optical measuring device according to an exemplary embodiment of the present invention.

FIG. 6 is a diagram illustrating exemplary thickness and reflectance outputs of a substrate for each of cell areas of a first optical measuring device according to an exemplary embodiment of the present invention. FIG. 6 includes a portion (a) and a portion (b).

Referring to FIG. 6, the reflectance and thickness of each cell area of the support substrate 10 may be determined by the controller 214. An exemplary thickness measurement for each of a plurality of cell areas is illustrated in FIG. 6, portion (a). An exemplary reflectance measurement for each of the plurality of cell areas is illustrated in FIG. 6, portion (b).

The controller 214 may determine a defective cell of which a reflectance and/or a thickness for each cell area is out of a predetermined range of reference values stored in the memory and may output a coordinate information of the defective cell.

The controller 214 may compare the reflection coefficient ratio (psi) and the phase difference (delta) of a p wave and an s wave with predetermined reference values to determine the defective cell.

Figure 7:
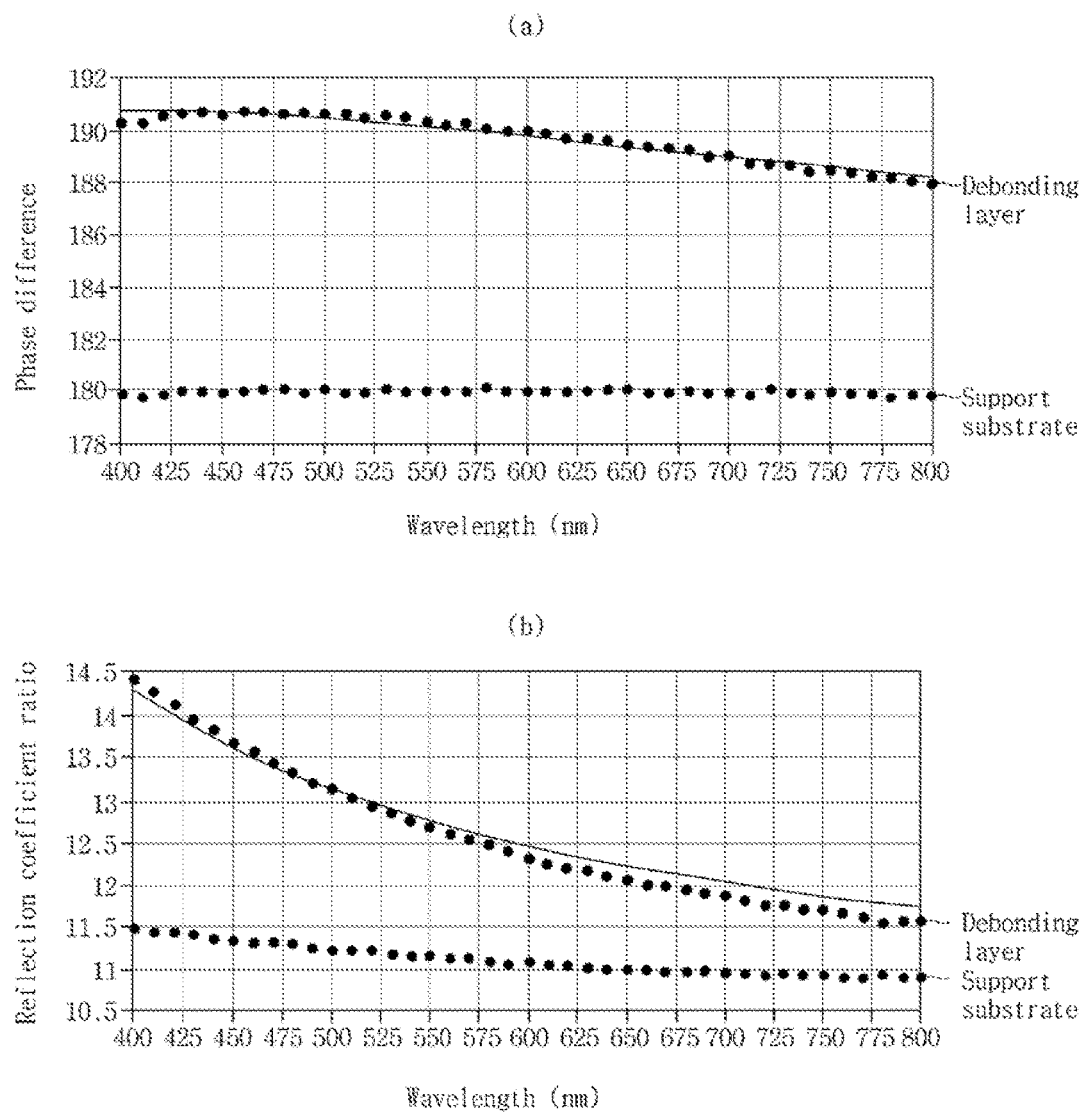
FIG. 7 is a graph of exemplary reflection coefficient ratios and phase differences from a first optical measuring device according to an exemplary embodiment of the present invention.

FIG. 7 is a graph of exemplary reflection coefficient ratios and phase differences from a first optical measuring device according to an exemplary embodiment of the present invention. FIG. 7 includes a portion (a) and a portion (b).

Referring to FIG. 7, the controller 214 may output the reflection coefficient ratio (psi) and the phase difference (delta) for each wavelength in each cell area. Exemplary phase differences for the debonding layer 20 and the support substrate 10 are illustrated in FIG. 7, portion (a). Exemplary reflection coefficient ratios for the debonding layer 20 and the support substrate 10 are illustrated in FIG. 7, portion (b). Defects may be determined by comparing values displayed in the graphs illustrated in FIG. 7 to predetermined reference values.

As an example, in the case of a debonding layer including three layers, psi of about 10 or more and delta of about 180 or more may be set to be normal, and a case where at least one of the psi or the delta is less than the aforementioned values may be determined as that the cell is defective.

The memory may store data and various programs executable by a processor, such as a general purpose computer processor, for controlling each element of the first optical measuring portion (e.g., e.g., optical measuring portion 210), and may also store data of various menu images for displaying data on a display area (e.g., through a computer monitor such as an LED monitor), coordinate values, or reference values used for comparison processing. The memory may store data and various programs executable by a processor, such as a general purpose computer processor, for controlling each portion of the coating portion 130. The data and files may be stored in an external database server, which may be in communication with the memory and the computer processor.

The heat treatment portion 140 applies heat to the support substrate 10 on which the coating layer 20 is formed to remove solutions and gas impurities included in the support substrate 10 on which the coating layer 20 is formed.

The support substrate 10 on which the coating layer 20 is heat treated to form a debonding layer 20 may be transferred to the second optical measuring portion 220.

The second optical measuring portion 220 may be a spectrometer.

An example in which a spectrometer is used as the second optical measuring device 220 will be described in more detail below; however, exemplary embodiments of the present invention are not limited thereto. The spectrometer 220 may measure light transmittance of the debonding layer 20.

The spectrometer 220 may include a light source 211, a light obtainer 222, a spectroscope 223, and a controller 224.

The light obtainer 222 may be disposed below the support substrate 10, may face the light source and may be located on an extension of a path of the light transmitted to the support substrate 10 from the light source 211.

The light obtainer 222 may calculate a light reflectance, which is a ratio of an amount of a reflected light to a total amount of the incident light, and a thickness of the debonding layer 20.

The spectroscope 223 measures an amount of the light incident toward the debonding layer 20 and transmitted through the support substrate 10.

The spectroscope 223 may perform measurement for each wavelength of light and may transmit the measurement result to the controller 224. The controller 224 may analyze the received measurement results. The light source 211 may emit light having a wavelength in a range of from about 400 nm to about 800 nm. The spectroscope 223 may perform measurement at intervals of about 30 seconds. As an example, thickness of the coating layer having a refractive index ranging from about 1.7 to about 1.75 may be set as a standard. However, exemplary embodiments of the present invention are not limited thereto.

The controller 224 may be electrically connected to an input device or a memory.

The controller 224 may interpret a signal transmitted from the spectroscope 223 based on an information stored in the memory. The controller 224 may be configured to classify (e.g., differentiate into distinct physical areas) the coating layer into a plurality of cell areas based on the information stored in the memory, may interpret the signals transmitted from the spectroscope 213, and may calculate a transmittance for each cell area and a thickness of each layer (a thickness of the debonding layer 20) of the support substrate 10. The controller 224 may be similar to the controller 214 described in more detail above, and thus duplicative descriptions may be omitted herein.

The memory may store data and various programs executed by a computer processor, such as a general purpose process, for controlling each element of the second optical measuring portion 220, and may store data of various menu images for displaying arbitrary data on a display area, coordinate values, or reference values used for comparison processing. These data and files may be stored in an external database server which may be in communication with the memory and the computer processor.

Figure 8:
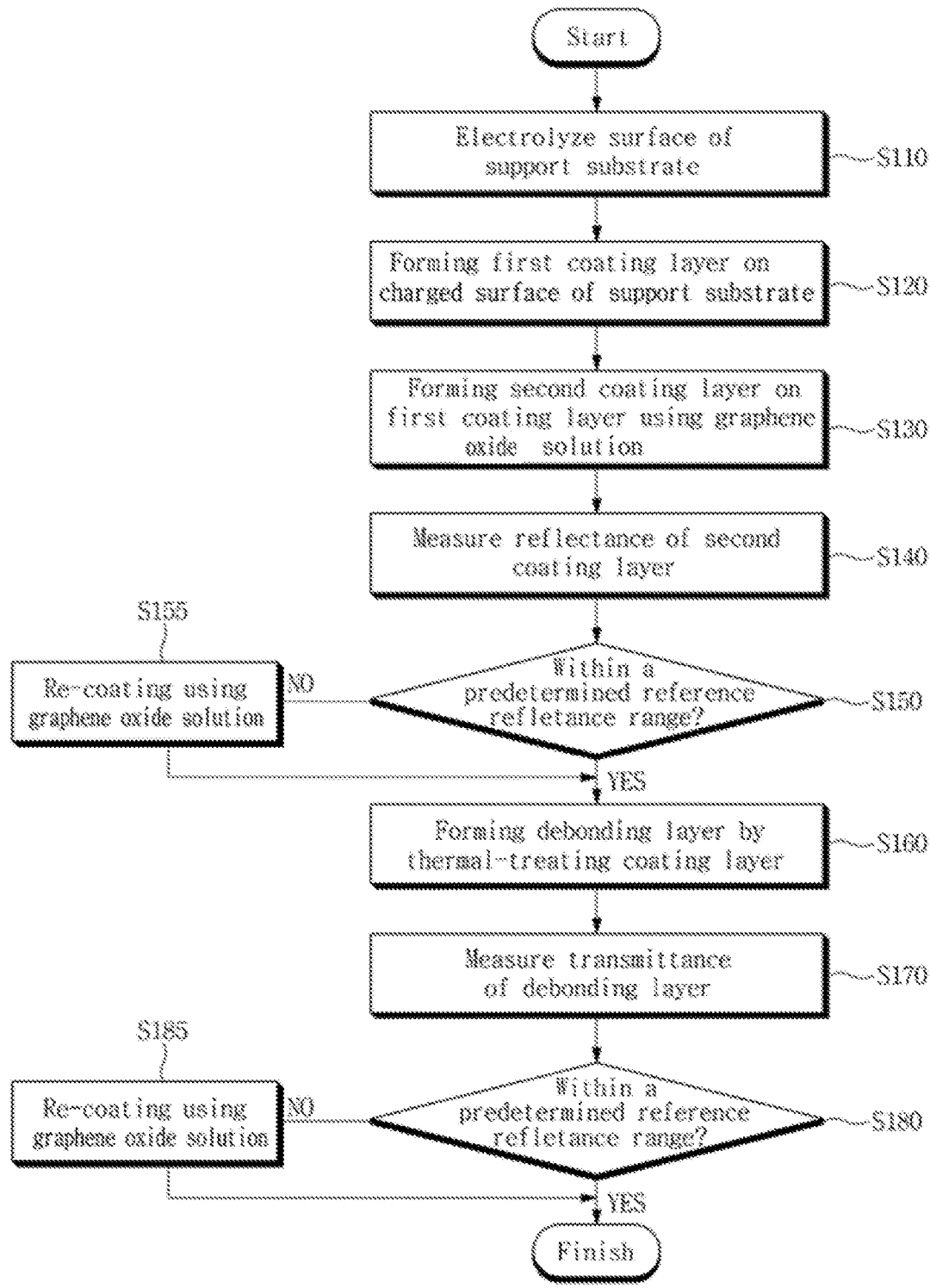
FIG. 8 is a flowchart of a method of forming a debonding layer according to an exemplary embodiment of the present invention.

FIG. 8 is a flowchart of a method of forming a debonding layer according to an exemplary embodiment of the present invention.

The system for forming a debonding layer mentioned below may be the same or substantially the same as the system described in more detail above, and thus a description of the above-described system of forming a debonding layer may be omitted below.

To form a coating layer by coating a graphene oxide layer on a support substrate (e.g., support substrate 10), a surface of the support substrate (e.g., an upper surface of the support substrate) is electrolytically treated (electrolyzed) so that the surface of the support substrate is negatively charged (S110).

A first coating layer is formed on the surface of the support substrate, which is negatively charged, using an electrostatic attraction force of a positively charged polymer electrolyte (S120).

The support substrate on which the first coating layer is formed is sprayed with a solution in which a graphene oxide which is negatively charged is dispersed to form a second coating layer on the first coating layer (S130).

The coating solution is sprayed onto the surface of the glass substrate or the solution is allowed to flow repeatedly on the surface of the glass substrate by using a shaker, so that the coating solution is supplied to the surface of the glass substrate. The solution is stirred to make a predetermined concentration of the graphene oxide uniform in the solution.

An excess graphene oxide remaining unadhered to the surface is washed off and the support substrate is dried.

A reflectance of each cell area of the second coating layer is measured by using an optical measuring portion (S140).

Based on the reflectance of each cell area, it is identified whether the reflectance of each cell area is within a predetermined reflection reference range (S150).

In the case where it is identified from the comparison in step S150 that the reflectance of each cell area of the second coating layer is out of the predetermined reference range, it is determined that the cell is defective and the graphene oxide is coated again to the defective cell in a spraying manner (S155).

In the case where it is identified from the comparison in step S150 that the reflectance of each cell area of the second coating layer is within the predetermined reference range, the support substrate on which the coating layer (e.g., coating layer 20) is heat-treated to form a debonding layer (S160). The predetermined reflection range may be a reference value (e.g., a reference value input in advance by an operator or designer).

After the step S160, a transmittance of the debonding layer is measured using a second optical measuring portion (S170).

Based on the transmittance of each cell area, it is identified whether the transmittance of each cell area is within a predetermined reference reflectance range (S180). The predetermined reference reflectance range may be a reference value (e.g., a reference value input in advance by an operator or designer).

In the case where it is identified from the comparison in step S180 that the transmittance of each cell area of the support substrate 10 on which the second coating layer is formed is out of the predetermined reference range, it is determined that the cell is defective. In an exemplary embodiment of the present invention, a coordinate information of the defective cell may be provided.

A debonding layer forming device may remove the grapheme oxide of the defective cell, and then re-coat the cell in a spraying manner. The debonding layer forming device acquires the coordinate information of the defective cell, and re-coats the graphene oxide solution to the defective cell of the obtained coordinates (S185).

The graphene oxide of the defective cell may be removed before the debonding layer forming device re-coats the defective cell.

According to an exemplary embodiment of the present invention, a case in which each of the first coating layer and the second coating layer is formed into a single layer is described by way of example, but exemplary embodiments of the present invention are not limited thereto. For example, the steps S120 and S130 may be performed one or more times to form one or more layers of coating layers.

In the case where the steps S120 and S130 are performed one or more times, the thickness of each coating layer may be measured by performing step S140 each time the step S130 ends.

According to an exemplary embodiment of the present invention, the debonding layer is uniformly formed, and an adhesive force between the debonding layer and the flexible substrate becomes uniform according to the thickness of the debonding layer, thus increasing the yield of the process.

Figure 9:
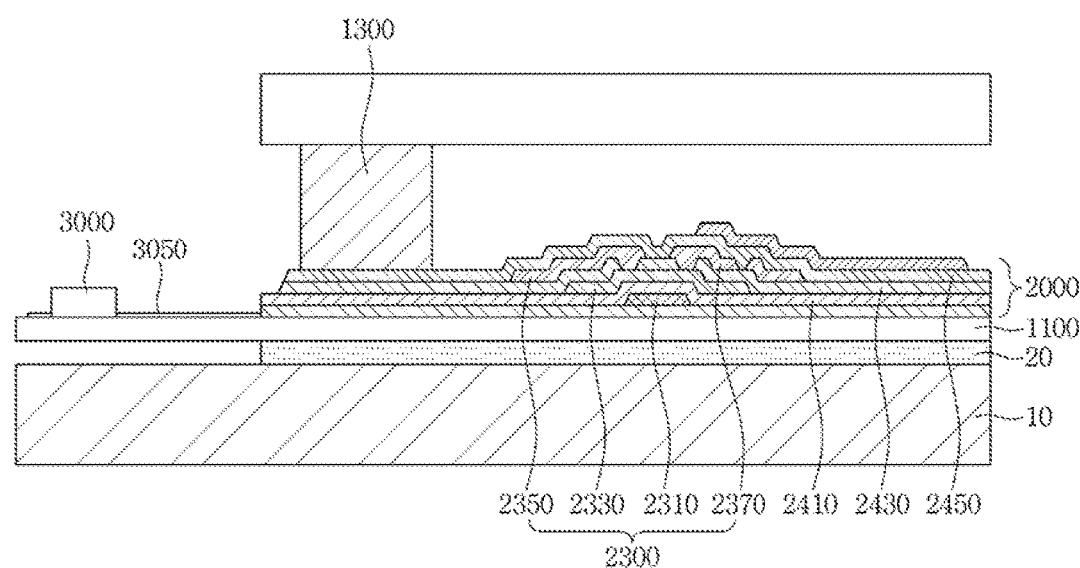
FIG. 9 is a cross-sectional view illustrating a display device using a debonding layer forming device according to an exemplary embodiment of the present invention.
Figure 10:
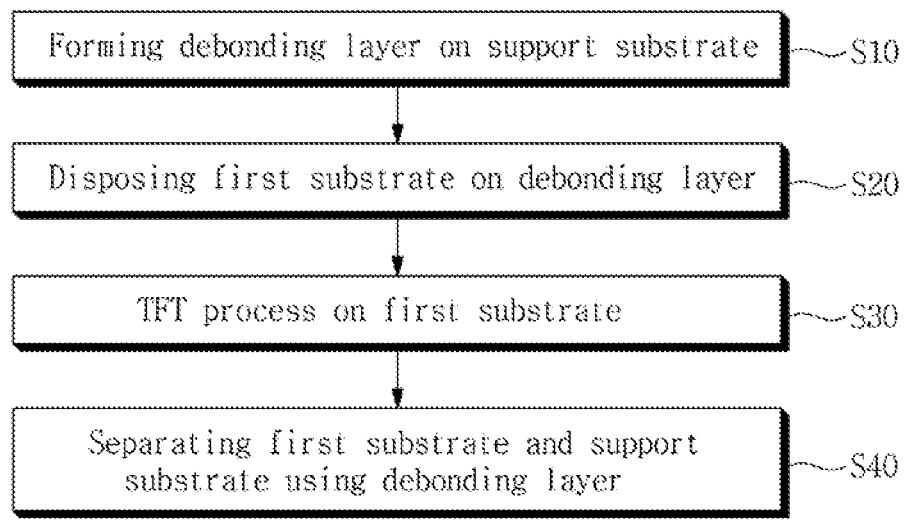
FIG. 10 is a flowchart of a method of manufacturing a display device using a debonding layer forming device according to an exemplary embodiment of the present invention.

FIG. 9 is a cross-sectional view illustrating a display device using a debonding layer forming device according to an exemplary embodiment of the present invention. FIG. 10 is a flowchart of a method of manufacturing a display device using a debonding layer forming device according to an exemplary embodiment of the present invention.

As described hereinabove with reference to FIG. 8, a debonding layer may be formed on a support substrate (S10).

The coating layer 20 may be a debonding layer. Referring to FIG. 9, a first substrate 1100 may be disposed on the debonding layer 20 (S20).

The first substrate 1100 may include a flexible material. An example of the flexible material may include plastic materials. For example, the first substrate 1100 may include at least one selected from kapton, polyethersulphone (PES), polycarbonate (PC), polyimide (PI), polyethyleneterephthalate (PET), polyethylenenaphthalate (PEN), polyacrylate (PAR), or fiber reinforced plastic (FRP).

Polyimide (PI) may have relatively high heat resistance and is suitable as a material for the first substrate 1100 to undergo a relatively high-temperature process.

A TFT process may be performed on the first substrate 1100 (530).

In the TFT process, a display element portion 2000, and a driving element 3000 may be disposed or formed.

A thin film transistor 2300 and a display element may be formed in a display portion of the first substrate 1100.

The thin film transistor 2300 may include a gate electrode 2310, a source electrode 2350, and a drain electrode 2370. The thin film transistor 2300 may be connected to a first wiring portion 3050 connected with the driving element 3000.

According to an exemplary embodiment of the present invention, the gate electrode 2310 may be disposed at a lower portion of the thin film transistor 2300, the source electrode 2350 and the drain electrode 2370 may be disposed thereabove, and a semiconductor layer 2330 may be disposed between the gate electrode 2310 and the source electrode 2350 and between the gate electrode 2310 and the drain electrode 2370.

In addition to the thin film transistor 2300, a gate insulating layer 2410 for insulating the gate electrode 2310 from the semiconductor layer 2330, an insulating interlayer 2430 between the source electrode 2350 and the semiconductor layer 2330 and between the drain electrode 2370 and the semiconductor layer 2330, and a protective layer 2450 covering the thin film transistor 2300 may be formed.

In the case where the display device is an LCD device, a pixel electrode electrically connected to the thin film transistor 2300 may be formed. In the case where the display device is an OLED display device, a pixel electrode electrically connected to the thin film transistor 2300, a pixel defining layer covering the pixel electrode, an intermediate layer including a light emitting layer formed on the pixel electrode, and an opposing electrode on the intermediate layer may be formed.

According to an exemplary embodiment of the present invention, the gate insulating layer 2410, the insulating interlayer 2430, and the protective layer 2450 may extend to below a sealing portion 1300 in a display area; however, exemplary embodiments of the present invention are not limited thereto. For example, the gate insulating layer 2410 need not extend to below the sealing portion 1300, and at least one of the insulating interlayer 2430 and the protective layer 2450 need not extend to below the sealing portion 1300.

The first substrate and the support substrate may be separated from each other using the debonding layer (S40).

The debonding layer 20 may include graphene, and the support substrate 10 on which the debonding layer is formed may be separated from the first substrate in a physical manner using a separation device.

In addition, the debonding layer formed according to an exemplary embodiment of the present invention may have a substantially uniform surface, such that damage to the first substrate and the display element may be substantially minimized when the first substrate and the support substrate are separated from each other.

Figure 11:
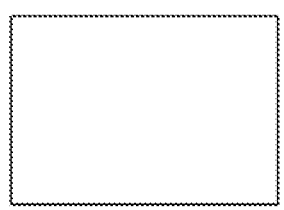
FIG. 11 is a series of cross-sectional views and plan views of a method of separation of a first substrate and a support substrate by a debonding layer according to an exemplary embodiment of the present invention.
Figure 11:
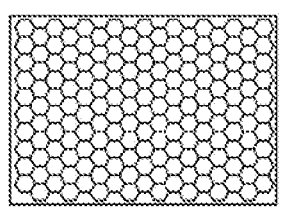
Figure 11:
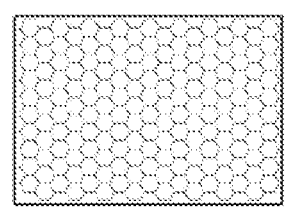
Figure 11:
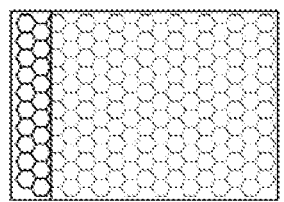
Figure 11:
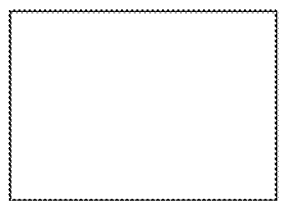
Figure 11:
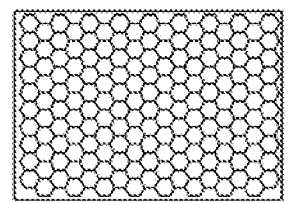

FIG. 11 is a series of cross-sectional views and plan views of a method of separation of a first substrate and a support substrate by a debonding layer according to an exemplary embodiment of the present invention. FIG. 11 includes portions (a), (b), (c), (d), (e) and (f).

Portions (a), (b), (c), (d), (e) and (f) of FIG. 11 each include a plan view and a cross-sectional view of a substrate at different stages of being separated from a support substrate.

FIG. 11, portion (a) is a view illustrating a support substrate (e.g., support substrate 10 described above in more detail), and FIG. 11, portion (b) shows that a plurality of layers of debonding layers may be formed on the support substrate.

The debonding layer may be a debonding layer formed according to an exemplary embodiment of the present invention (e.g., debonding layer 20).

Grapheme may include a single layer or multiple layers of carbon atom covalently linked. In an exemplary embodiment of the present invention, carbon atoms may form each layer on the basis of a 6-membered ring, and may further include a 5-membered ring or a 7-membered ring.

FIG. 11, portion (c) shows that a substrate may be disposed on the debonding layer.

FIG. 11, portion (d) shows separation of the support substrate and the substrate, FIG. 11, portion (e) shows the separated substrate, and FIG. 11, portion (f) shows the support substrate after the substrate is separated.

A part of the debonding layer may remain on a back surface of the substrate after the separation, as shown in FIG. 11, portion (e), for example.

Thus, a surface of the debonding layer may be substantially uniformly formed to facilitate separation of a support substrate and a substrate of the display device.

While the present invention has been illustrated and described with reference to the exemplary embodiments thereof, it will be apparent to those of ordinary skill in the art that various changes in form and detail may be formed thereto without departing from the spirit and scope of the present invention.

What is claimed is:

1. A system of forming a debonding layer comprising:
   a debonding layer forming device configured to form a coating layer by coating a graphene oxide layer on a support substrate and to form a debonding layer by heat-treating the coating layer; and
   an optical measuring device configured to classify a region of the support substrate by differentiating distinct physical areas of the region into a plurality of cell areas based instructions stored in a memory and to measure a thickness of at least one of the coating layer or the debonding layer in at least one cell area of the plurality of cell areas.

2. The system of claim 1, wherein the optical measuring device outputs a coordinate information of a defective cell of the plurality of cell areas based on a value measured by the optical measuring device that is out of a predetermined reference range.

3. The system of claim 2, wherein the debonding layer forming device re-coats a re-coated graphene oxide layer on the support substrate of the defective cell area based on the coordinate information.

4. The system of claim 1, wherein the optical measuring device comprises an ellipsometer for measuring a reflectance of the coating layer.

5. The system of claim 1, wherein the optical measuring device comprises a spectrometer for measuring a transmittance of the debonding layer.

6. The system of claim 1, wherein the optical measuring device irradiates a light having a wavelength in a range from about 400 nm to about 800 nm to the support substrate to measure the thickness of the at least one of the coating layer or the debonding layer.

7. The system of claim 1, wherein the debonding layer forming device electrolytically treats a surface of the support substrate so that the surface of the support substrate is negatively charged, forms a first coating layer on the surface of the support substrate by using an electrostatic attraction force of a positively charged polymer electrolyte, and forms a second coating layer on the first coating layer by coating a negatively charged graphene oxide cm the first coating layer.

8. The system of claim 7, wherein the debonding layer forming device repeats formation of the first coating layer or formation of the second coating layer one or more times.

9. A method of forming a debonding layer, the method comprising:
   forming a coating layer by coating a graphene oxide layer on a support substrate;
   forming a debonding layer by heat-treating the coating layer; and
   classifying a region of the support substrate by differentiating distinct physial areas of the region into a plurality of cell areas based on instructions stored in a memory and measuring a thickness of at least one of the coating layer or the debonding layer in at least one cell area of the plurality of tell areas.

10. The method of claim 9, wherein measuring of a thickness of at least one of the coating layer and the debonding layer comprises:
    measuring a reflectance or a transmittance of each of the cell areas of the plurality of cell areas;

calculating a thickness of each of the cell areas of the plurality of cell areas based on the reflectance or transmittance;

comparing the thickness of each of the cell areas of the plurality of cell areas with a predetermined reference range; and when there is a defective cell area in which the thickness is out of the predetermined reference range, determining a coordinate information of the defective cell area.

11. The method of claim 10, further comprising re-coating a second graphene oxide layer on the support substrate of the defective cell area based on the coordinate information of the defective cell area.

12. The method of claim 9, wherein a reflectance of the coating layer is measured by an ellipsometer.

13. The method of claim 9, wherein a transmittance of the debonding layer is measured by a spectrometer.

14. The method of claim 9, wherein light having a wavelength in a range from about 400 nm to about 800 nm is transmitted to the support substrate to measure a thickness of the support substrate.

15. The method of claim 9, wherein forming the coating layer comprises:

electrolytically treating a surface of the support substrate so that the surface of the support substrate is negatively charged;

forming a fast coating layer on the surface of the support substrate by using an electrostatic attraction force of a positively charged polymer electrolyte, and forming a second coating layer on the first coating layer by coating a negatively charged graphene oxide on the first coating layer.

16. The method of claim 15, wherein the forming of the first coating layer or the forming of the second coating layer are repeated one or more times.

17. A method of manufacturing a display device, the method comprising:

forming a coating layer by coating a graphene oxide layer on a support substrate;

forming a debonding layer by heat-treating the coating layer;

classifying a region of the support substrate by differentiating distinct physical areas of the region into a plurality of cell areas based on instructions stored in a memory;

measuring a thickness of at least one of the coating layer or the debonding layer in at least one cell area of the plurality of cell areas;

forming a substrate on the debonding layer;

performing a TFT process on the substrate; and separating the substrate and the support substrate by using the debonding layer.

18. The method of claim 17, wherein coordinate information of a defective cell having a thickness that is out of a predetermined reference range is determined.

19. A method of manufacturing a display device, the method comprising:

forming a coating layer by coating a graphene oxide layer on a support substrate, wherein the coating layer is formed by electrolytically treating a surface of the support substrate so that the surface of the support substrate is negatively charged, forming a first coating layer on the surface of the support substrate by using an electrostatic attraction force of a positively charged polymer electrolyte, and forming a second coating layer on the first coating layer by coating a negatively charged graphene oxide on the first coating, layer;

forming a debonding layer by heat-treating the coating layer;

disposing a substrate on the debonding layer;

performing a TFT process on the substrate;

separating the support substrate and the debonding layer;

classifying the support substrate into a plurality of cell areas; and measuring a thickness of one or more of the coating layer or the debonding layer for each cell area of the plurality of cell areas.

20. The method of claim 19, wherein measuring of a thickness of one or more of the coating layer or the debonding layer comprises:

measuring a reflectance or a transmittance of each of the cell areas of the plurality of cell areas;

calculating a thickness of each of the cell areas of the plurality of cell areas based on the reflectance or transmittance;

comparing the thickness of each of the cell areas of the plurality of cell areas with a predetermined reference range; and when there is a defective cell area in which the thickness is out of the predetermined reference range, determining a coordinate information of the defective cell area.

\* \* \* \* \*